(12) United States Patent
Thuaire et al.

(10) Patent No.: US 10,858,244 B2
(45) Date of Patent: Dec. 8, 2020

(54) DEVICE FOR CONNECTING AT LEAST ONE NANO-OBJECT ASSOCIATED WITH A CHIP ENABLING A CONNECTION TO AT LEAST ONE EXTERNAL ELECTRICAL SYSTEM AND METHOD OF FABRICATION THEREOF

(71) Applicant: Commissariat A L'Energie Atomique et aux Energies Alternatives, Paris (FR)

(72) Inventors: Aurelie Thuaire, Voiron (FR); Patrick Reynaud, Murianette (FR); Patrick Leduc, Grenoble (FR); Emmanuel Rolland, Jarrie (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 69 days.

(21) Appl. No.: 15/283,683

(22) Filed: Oct. 3, 2016

(65) Prior Publication Data
US 2017/0098638 A1 Apr. 6, 2017

(30) Foreign Application Priority Data
Oct. 5, 2015 (FR) .................................... 15 59467

(51) Int. Cl.
| | |
|---|---|
| *B81B 7/00* | (2006.01) |
| *H01L 25/16* | (2006.01) |
| *H01L 23/498* | (2006.01) |
| *H01L 23/538* | (2006.01) |
| *H01L 25/11* | (2006.01) |

(Continued)

(52) U.S. Cl.
CPC ........ *B81B 7/007* (2013.01); *H01L 23/49844* (2013.01); *H01L 23/5389* (2013.01);
(Continued)

(58) Field of Classification Search
CPC .......... H01L 23/5389; H01L 23/49844; H01L 25/115; H01L 25/50; B81B 7/007; B81B 2207/07; B81B 2207/096; B81B 2207/097
See application file for complete search history.

(56) References Cited

U.S. PATENT DOCUMENTS

| | | | |
|---|---|---|---|
| 7,894,201 B2* | 2/2011 | Murayama | .......... H01L 21/4846 |
| | | | 361/761 |
| 8,115,283 B1* | 2/2012 | Bolognia | .............. B81B 7/0064 |
| | | | 257/659 |

(Continued)

FOREIGN PATENT DOCUMENTS

| | | |
|---|---|---|
| EP | 2 145 854 A1 | 1/2010 |
| WO | WO 2009/022982 A1 | 2/2009 |

OTHER PUBLICATIONS

French Preliminary Search Report dated Aug. 24, 2016 in French Application 15 59467, filed on Oct. 5, 2015 ( with English Translation of Categories of cited Documents).

(Continued)

*Primary Examiner* — Mark W Tornow
*Assistant Examiner* — Abbigale A Boyle
(74) *Attorney, Agent, or Firm* — Oblon, McClelland, Maier & Neustadt, L.L.P.

(57) ABSTRACT

Production of a device for connecting a nano-object to an external electrical system (SEE) including:
a first chip provided with conducting areas (8a, 8b) and a first nano-object (50) connected to the conducting areas, the first chip being assembled on a support (70) such that the first nano-object is arranged facing an upper face of the support, the device being further provided with first connection elements (80a, 80b) capable of being connected to the external electrical system and arranged on and in contact with the first conducting areas (8a, 8b), the first connection elements (Continued)

being formed on the side of the upper face of the support (70) and being accessible from the side of the upper face of the support.

9 Claims, 5 Drawing Sheets

(51) Int. Cl.
*H01L 25/00* (2006.01)
*H01L 27/28* (2006.01)
*H01L 29/06* (2006.01)
*H01L 51/00* (2006.01)

(52) U.S. Cl.
CPC .......... *H01L 25/115* (2013.01); *H01L 25/162* (2013.01); *H01L 25/165* (2013.01); *H01L 25/50* (2013.01); *H01L 27/286* (2013.01); *B81B 2207/07* (2013.01); *B81B 2207/096* (2013.01); *B81B 2207/097* (2013.01); *H01L 29/0665* (2013.01); *H01L 51/0098* (2013.01)

(56) References Cited

U.S. PATENT DOCUMENTS

| | | | |
|---|---|---|---|
| 8,692,385 B2* | 4/2014 | Thuaire | H01L 21/76898 |
| | | | 257/724 |
| 2010/0013034 A1 | 1/2010 | Parbaud et al. | |
| 2012/0112334 A1* | 5/2012 | Baillin | H01L 23/26 |
| | | | 257/682 |
| 2012/0146071 A1 | 6/2012 | Tsang | |
| 2012/0161333 A1 | 6/2012 | Thuaire et al. | |
| 2013/0256919 A1 | 10/2013 | Scholz et al. | |
| 2013/0293428 A1* | 11/2013 | Souriau | H01L 23/66 |
| | | | 343/702 |
| 2014/0203796 A1* | 7/2014 | Mohammadi | B82Y 10/00 |
| | | | 324/76.11 |

OTHER PUBLICATIONS

B. Weber et al. "Ohm's Law Survives to the Atomic Scale", Science vol. 335, 2012, 5 pages.
U.S. Appl. No. 14/408,478, filed Dec. 16, 2014, 2015/0243594 A1, Xavier Baillin et al.

* cited by examiner

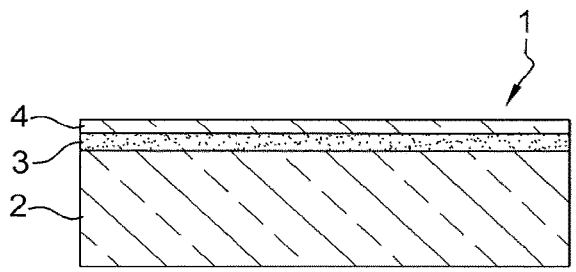
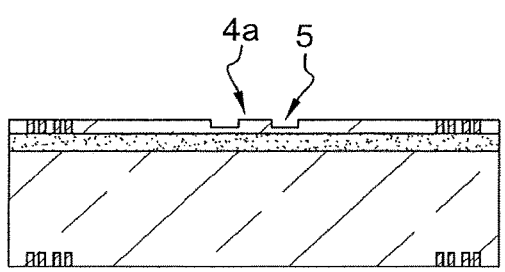
Fig. 2A — Fig. 2B
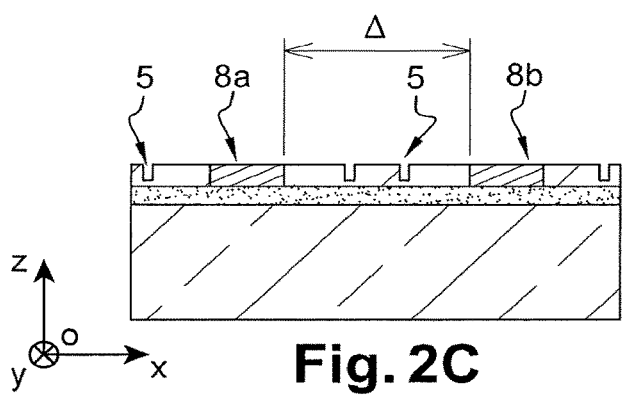
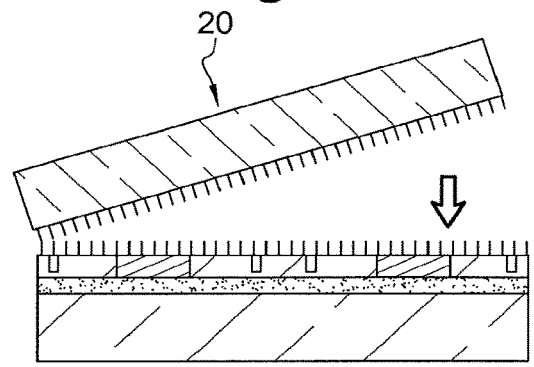
Fig. 2C — Fig. 2D
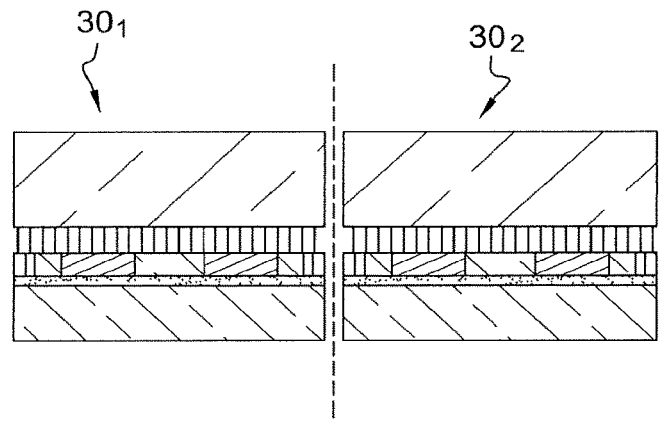
Fig. 2E
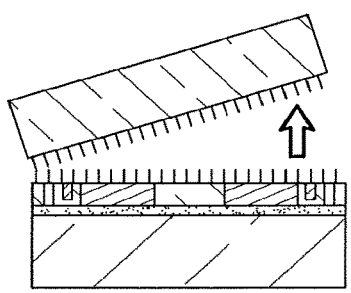
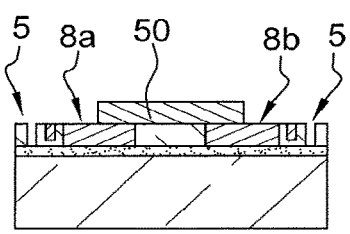
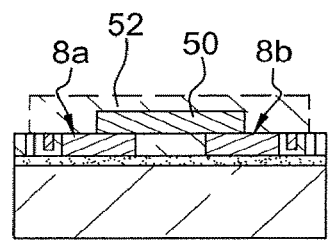
Fig. 2F — Fig. 2G — Fig. 2H

DEVICE FOR CONNECTING AT LEAST ONE NANO-OBJECT ASSOCIATED WITH A CHIP ENABLING A CONNECTION TO AT LEAST ONE EXTERNAL ELECTRICAL SYSTEM AND METHOD OF FABRICATION THEREOF

TECHNICAL FIELD AND PRIOR ART

The present invention relates to a device for connecting nano-objects to at least one external electrical system as well as a method for manufacturing such a device.

"Nano-objects" is taken to mean objects of which at least one of the dimensions lies in the interval ranging from 0.1 nm to 1000 nm and more particularly from 1 nm to 100 nm, and included in this category of nano-objects are notably nanoparticles (organic or inorganic), nano-wires, molecules or associations of molecules, notably biological molecules such as viruses and bacteria.

It is today sought to characterize smaller and smaller nano-objects or to manufacture structures at the nanometric scale. It is thus necessary to manufacture a device making it possible to measure electrically these nano-objects and to be able to connect them to an external electrical system configured to carry out an electrical test of nano-objects.

The document US 2012/0161333 A1 provides for an electrical connection of a nano-object via the rear face of a substrate, using a connection element traversing the substrate.

To produce such a device and to be able to connect the nano-object it is generally necessary to traverse the whole thickness of the substrate. Yet such a substrate may have a thickness of the order of several hundreds of microns.

The document WO 2009/022982 A1 for its part provides for an electrical connection of a nano-object via the rear face of a substrate, while passing through a cavity formed in a portion of the thickness of the substrate, the nano-object being formed on a remaining portion of the substrate.

This remaining portion may prove to be fragile.

The problem is posed of producing a novel device for connecting a nano-object as well as a novel method for producing such a device.

DESCRIPTION OF THE INVENTION

An embodiment of the present invention provides for a device for connecting at least one nano-object to an external electrical system, the device including: at least one first chip provided with one or more conducting areas and at least one first nano-object connected to a first conducting area and to a second conducting area among said conducting areas, the first chip being assembled on a support such that the first nano-object is arranged facing an upper face of the support, the device being further provided with connection elements capable of being connected to the external electrical system and arranged respectively on and in contact with the first conducting areas and with the second conducting area, the first connection elements being formed on the side of the upper face of the support and being accessible on the side of the upper face of the support.

A face called "first face" of the first chip on which the nano-object is situated is arranged facing the upper face of the support. The connection elements are situated on a second face of the first chip, that is to say the face of the first chip opposite to the first face.

A lower face of the support opposite to said upper face forms a rear face of the device. The connection elements are accessible on the side of the front face of the device, that is to say a face of the device opposite to the rear face of the device, in other words to the lower face of the support.

With such a layout of the connection elements, the formation of connections traversing the support is not indispensable for making it possible to connect the nano-object to an external electrical system.

Such a layout also makes it possible to implement connection elements of short length, which notably makes it possible to carry out electrical measurements of improved sensitivity on the nano-object.

According to a possibility of implementation of the device, at least one second chip may be arranged on the support, the second chip also being provided with one or more second conducting areas and a second nano-object connected to said second conducting areas.

Advantageously, the support comprises at least one cavity at the level of its upper face, the first nano-object thus not finding itself in contact with said support.

It is thus possible to produce a device of which the size is smaller while preserving this nano-object and while assuring a protection thereof.

According to an embodiment, another electrical connection element connected to the first nano-object traverses the support, this other connection element emerging on a lower face of the support opposite to the upper face.

The device may further include at least one electronic circuit provided with one or more components, the circuit being assembled on the upper face of the support.

The device may further include an electronic circuit integrated in the support.

The device may also include an electronic circuit integrated in the support assembled on the first chip and connected to the first nano-object.

The electronic circuit may be provided with amplification and/or filtering means, in order to filter and/or amplify electrical test signals from the nano-object.

According to another aspect, an embodiment of the present invention provides for a method for producing a device for connecting at least one nano-object to an external electrical system, the method including the steps consisting in:

assembling on a support a first chip provided with conducting areas and a first nano-object connected to said conducting areas, the assembly of the first chip on the support being carried out such that the first nano-object is arranged facing an upper face of the support, producing on the side of the upper face of the support one or more first connection elements arranged on and in contact with conducting areas.

Advantageously, the nano-object is situated on a first face of the first chip, opposite to a second face, the method further including between the assembly and the production of connection elements: a step consisting in removing a thickness of the first chip from the side of its second face.

Thus, this removal is carried out once the assembly has been carried out, which makes it possible to form an access to the conducting areas of the chip without damaging it, the support assuring mechanical rigidity during the removal.

The first chip may be formed from a substrate on which said conducting areas are produced.

The method may further include a step of cutting the substrate into several chips. This notably enables a collective production of chips before assembly with the support.

According to a possibility of implementation of the method in which the nano-object is formed on a first face of the first chip after the step of cutting of the substrate, and in which, prior to cutting, a protective cover is formed on the first face, the removal of this protective cover is carried out prior to the formation of the first nano-object on the first face of the first chip.

The nano-object may be formed on a first face of the first chip before the step of cutting of the substrate, the cutting of the substrate then being carried out after formation of a protective cover on the first face.

According to a possibility of implementation of the method, the first nano-object may be positioned on an area of interest of the first chip while using patterns or reference points delimiting this area of interest. The patterns may be for example in the form of holes or trenches.

After assembly of the first chip on the support, it is possible to form a wall, advantageously insulating, around the first chip. This insulating wall may serve both for the protection and the electrical insulation of the first chip.

A possibility of implementation of the method provides for a step of assembling a dummy block on the upper face of the support.

Such a dummy block, when it is coupled to the first chip, may make it possible to improve the cohesion of the assembly between the first chip and the support.

Such a dummy block may also make it possible to limit the relief of the assembly between support and first chip.

BRIEF DESCRIPTION OF THE DRAWINGS

The present invention will be better understood on reading the description of examples of embodiment given for purely indicative purposes and in no way limiting, while referring to the appended drawings in which:

FIGS. 2A-2L illustrate, by means of transversal sectional views, an example of method for producing such a device;

Identical, similar or equivalent parts of the different figures bear the same numerical references so as to make it easier to go from one figure to the next.

The different parts represented in the figures are not necessarily according to a uniform scale in order to make the figures more legible.

Moreover, in the description hereafter, terms that depend on orientation, such as "front", "rear", "upper", "lower", etc. of a structure apply by considering that the structure is oriented in the manner illustrated in the figures.

DETAILED DESCRIPTION OF PARTICULAR EMBODIMENTS

Figure 1:
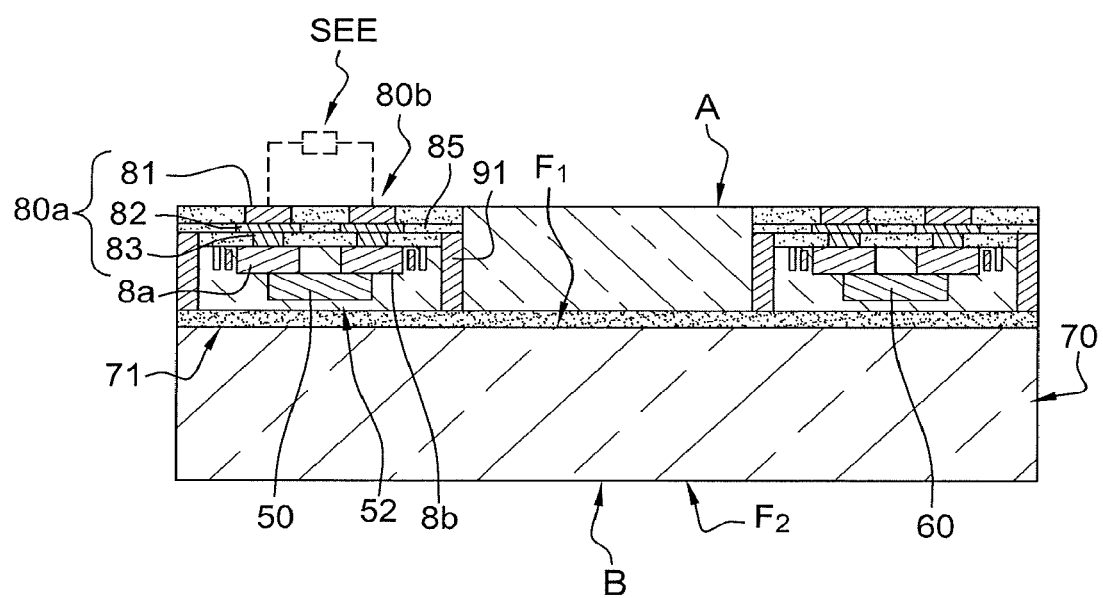
FIG. 1 serves to illustrate a device following an embodiment of the present invention for connecting at least one nano-object formed on a chip transferred onto a substrate.

Reference is now made to FIG. 1, which gives a schematic sectional view of a particular embodiment of a device for connecting one or more nano-object(s) to an external electrical system.

In the example of FIG. 1, the device is intended to connect a first nano-object 50, for example in the form of a molecule, to an external electrical system SEE.

The electrical system may notably be an integrated circuit provided with characterization means or control means or reading means. This system makes it possible, for example, to determine the electrical properties of the nano-object 50.

The external electrical system SEE may be configured to receive and/or send signals to the nano-object. These signals may be of different types depending on the physical characteristics that it is sought to measure or to transmit. The electrical system may be adapted to measure physical quantities such as voltage, current, impedance, capacitance. The measurement parameters will be adapted so as not to damage the nano-object. Typically, during the measurement of a nano-object in the form of a set of biological fibres of several microns length and 6 to 10 nm diameter, it is possible to apply a voltage for example of the order of 3V and measure a current I of the order for example of ten or so nano-Amperes traversing said nano-object.

The nano-object 50 is integrated on an element, such as a chip $30_1$, equipped with conducting areas 8a, 8b to which the first nano-object 50 is connected.

Typically, the conducting areas 8a, 8b are separate and extend in a same plane parallel to the main plane of the support. Main plane of the support is taken to mean a plane passing through the support and which is parallel to the plane [O; x; y°] of the reference point [O; x; y; z] in FIG. 2C. The conducting areas 8a, 8b are advantageously doped semiconductor areas of a same layer.

The chip $30_1$ rests and is assembled on an upper face F1 of a support 70. The chip $30_1$ may be turned over on the support 70 such that a face called "first face" on which the nano-object 50 is placed is located facing the upper face of the support 70.

The external electrical system SEE is connected to the nano-object 50 via connection elements 80a, 80b arranged on and in contact with conducting areas 8a, 8b of the first chip $30_1$ in order to be able to make a current flow through the nano-object 50.

The connection elements 80a, 80b are placed on the side of the upper face $F_1$ of the support 70 and a face of the first chip $30_1$ called "second face", the second face being opposite to said first face. These connection elements 80a, 80b may be formed of at least one pad 81 and/or at least one conducting line 82 and/or at least one conducting via 83 traversing a layer or a stack of insulating layers 85 covering the first chip $30_1$.

With such an arrangement, the connection elements 80a, 80b are advantageously accessible at the front face A of the device, on the side of the support-chip assembly where the nano-object 50 is located. The rear face B of the device opposite to said front face A corresponds to the lower face F2 of the support, in other words to the face of the support that is opposite to its upper face F1.

The arrangement of the elements 80a, 80b makes it possible to produce a connection of short distance between the nano-object 50 to characterize and the external electrical system, which makes it possible to improve measurement sensitivity. In particular a shorter connection is produced, for example of length of the order of 400 nm, than with a connection element traversing the support 70, the latter being able to have a thickness for example of the order of several hundreds of micrometres and typically of the order of 725 µm.

The support 70 is for example in the form of a semiconductor substrate and is capable of receiving, as in the particular example of embodiment of FIG. 1, at least one other chip $30_2$. This other chip $30_2$ may also be provided with another nano-object 60, for example another molecule. Thus, it is possible to jointly integrate on the same support 70 several chips $30_1$, $30_2$ with different nano-objects. A particular embodiment of the device provides for integrating both organic and inorganic nano-objects. The chips $30_1$, $30_2$ may come from different laboratories or manufacturing sites.

With such a device, it is also possible to carry out an individual addressing and an electrical measurement on each of the chips taken individually or in a variant to implement a collective electrical characterization of several chips $30_1$, $30_2$, and potentially to interconnect several chips in series using a collective contact pick-up.

An example of electrical test consists in applying a voltage between the elements 80a, 80b connected respectively to the conducting areas 8a, 8b of the first chip $30_1$ and measuring a current traversing the nano-object for example in the form of a molecule.

In the particular example of embodiment of FIG. 1, the support 70 on which the chips $30_1$, $30_2$ rest is covered with a layer 71 based on dielectric material, for example $SiO_2$, which can serve as both bonding interface and electrical insulation.

An encapsulation layer 52 covering and protecting the nano-object 50 may also be provided. This encapsulation layer 52 may be for example a layer of semiconductor material or advantageously an insulating layer.

To improve the electrical insulation and the protection of the first chip $30_1$, this may also be surrounded by insulating walls 91 for example based on polymer material or $SiO_2$, configured to form a protective insulating enclosure around the chip $30_1$.

An example of method of manufacturing a device of the type of that described previously will now be described in relation with FIGS. 2A-2L.

The starting material for this method may be a substrate 1 of semiconductor on insulator type (FIG. 2A) in particular of SOI (Silicon On Insulator or GeOI or SiGeOI type including a semiconductor support layer 2 coated with an insulating layer 3 designated BOX (for Buried Oxide), itself coated with a superficial semiconductor layer 4, for example based on Si, or Ge or SiGe. The superficial layer 4 may have a thickness for example comprised between 10 nm and 1 µm, whereas the $SiO_2$ layer is comprised between 10 nm and several µm. The semiconductor support layer 2 may, for its part, have a thickness comprised between 625 µm and 1.5 mm.

Patterns are then produced in the superficial layer 4, in particular in the form of trenches 5 in order to delimit one or more areas of interest 4a of the superficial layer 4, each area of interest being capable of receiving at least one nano-object (FIG. 2B). The trenches 5 thus form locating marks situated around areas of interest 4a and making it possible to locate these areas 4a. The area(s) of interest 4a may have a surface area for example comprised between 10 nm² and 1 mm², in particular between 0.01 µm×0.01 µm and 10 µm×10 µm. To produce the trenches 5 a photolithography technique is for example used during which a resin mask is formed, then an etching of the semiconductor layer 4 is carried out through this mask and finally the resin mask is removed.

Then, conducting areas are formed in the superficial layer 4. These conducting areas are in this example doped areas 8a, 8b produced in the area(s) of interest 4a in particular by implantation through a masking (not represented).

The doped areas 8a, 8b produced inside a perimeter delimited by the trenches 5 or locating marks are capable of being placed in electrical contact with at least one nano-object. Typically, it is possible to produce two separate P or N doped areas per area of interest 4a. The distance Δ between the two doped areas 8a, 8b may be comprised for example between several nanometres and several hundreds of microns. This distance Δ depends on the size of the nano-object that will be placed in contact with these areas 8a, 8b.

As an example, a distance Δ of 0.1 µm may be provided when the nano-object has a length of the order of 150 nm.

It is then possible to carry out a step of surface preparation of the superficial layer 4 in order in particular to functionalize it and potentially to be able to carry out later on this surface a grafting of molecule(s) or instead the manufacture of a nano-object.

This functionalization may be carried out by thermal treatment and/or chemical treatment. It is preferably preceded by surface cleaning to remove potential contaminants. A cleaning of type commonly called "RCA" or "piranha" may be carried out.

Then, cleaning is carried out in a hydrofluoric (HF) acid solution making it possible to obtain a hydrophobic surface, composed in particular of Si—H bonds. A thermal treatment is then carried out so as to order the atoms on the surface.

Typically, an annealing between 850° C. and 1200° C. for several minutes, for example of the order of 7 min, under hydrogen-containing atmosphere, makes it possible to obtain a Si—H saturated functionalized surface where molecules can attach themselves.

Advantageously, the thermal treatment implemented during the surface preparation of the superficial layer 4 also makes it possible to activate the P or N dopants implanted previously in order to produce the conducting areas 8a, 8b. When such a treatment is carried out on a silicon wafer Si(100), a reconstructed surface Si(001)-(2×1) is obtained.

Then, a temporary protective cover 20 may be assembled on a first face of the substrate 1, that is to say that on which the superficial layer 4 is situated (FIG. 2D).

A hermetic protection of the first face of the substrate 1 is thereby assured. The assembly of the cover 20 on the substrate 1 may be carried out by bonding by molecular adhesion, in particular of hydrophobic type and during which the surface of the superficial layer 4 and for example saturated by Si—H bonds rendered hydrophobic may be connected to another surface provided with Si—H bonds. Bonding by molecular adhesion may be carried out at ambient temperature, typically of the order of 20° C.

Then, a cutting is carried out of the substrate 1 assembled to the temporary cover 20 into several elements $30_1$, $30_k$ also called chips (FIG. 2E).

The chips $30_1$, $30_k$ may have a size comprised for example between several mm and several tens of centimetres, typically of the order of 1 cm². The cutting may potentially be carried out so as to produce elements or chips of different sizes with respect to each other. This cutting is for example carried out using an equipment provided with a thin blade for example of the order of 100 µm thickness.

In FIG. 2F, a later step of removal of the temporary cover 20 on a first chip $30_1$ among the plurality of cut chips is illustrated. The taking away of the temporary cover 20 may be carried out, for example, using a blade that is inserted at the level of the bonding interface between the cover 20 and the first chip $30_1$ and which is then used as a lever.

A nano-object 50 is then formed on the upper face of the first chip $30_1$ that is to say that on which the conducting areas 8a, 8b have been produced (FIG. 2G).

The nano-object 50 is arranged so as to be in contact with part of the implanted areas. The nano-object 50 may be for example in the form of organic or inorganic nano-particles, molecule(s), in particular biological molecule(s), such as a protein, DNA, a virus, or an antibody. According to another example, the nano-object 50 may be a nano-wire.

"Formation" of the nano-object includes notably a surface modification (functionalization) and/or a grafting, or a bonding, or a deposition followed potentially by structuring.

The precise placement of the nano-object 50 on the area of interest 4a and the conducting areas 8a, 8b of this area 4a may be carried out in an automated manner by an equipment configured to detect the locating marks 5.

An encapsulation layer 52 may then be formed so as to protect the nano-object 50 (FIG. 2H).

For a nano-object 50 of organic nature, the encapsulation layer 52 may be for example provided based on resin. The encapsulation layer 52 is formed preferably at low temperature. For an inorganic nano-object 50, it is possible for example to provide an encapsulation layer 52 made of silicon or silicon oxide. A particular example of embodiment provides for forming a semiconductor encapsulation layer 52 by epitaxial growth on the superficial layer 4 of the substrate or an insulating layer produced for example by deposition. For a nano-object 50 of several nanometres height, an encapsulation layer 52 of the order of 20 nm thickness is for example provided.

Then, the first chip $30_1$ is assembled on a support 70, for example a semiconductor substrate based on silicon, or germanium, or SiGe, or instead glass or mica.

The support 70 may be in particular a silicon wafer of diameter of the order of 100 mm, or 150 mm, or 200 mm, or 300 mm, or more. The support 70 for receiving the first chip $30_1$ may have a thickness for example of the order of 725 µm.

Figure 2I:
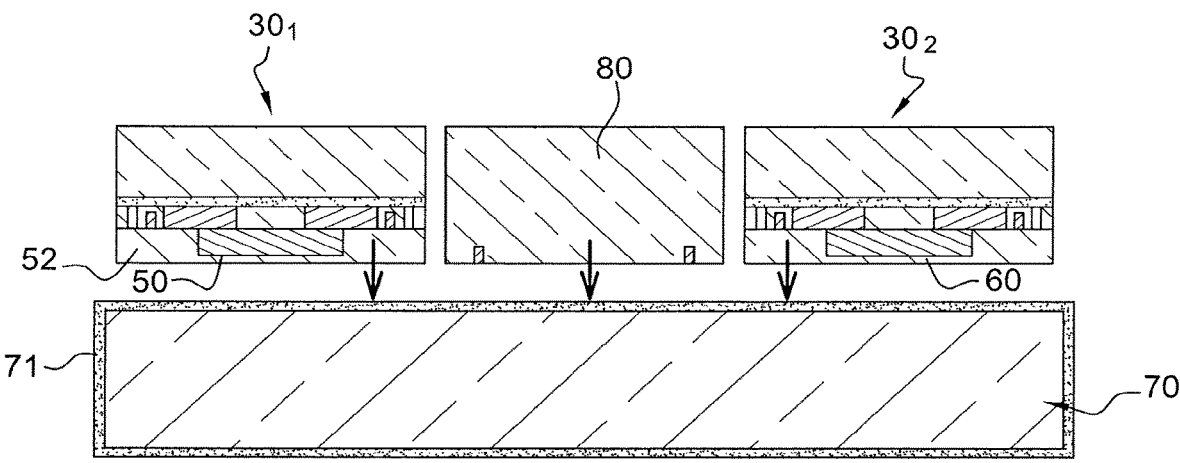

In the particular example of FIG. 2I, the support 70 is coated on its surface with a passivation layer 71 for example based on $SiO_2$ or $Si_3N_4$ for example.

At this stage of the method, the support 70 on which the chip $30_1$ is assembled may be provided with an integrated electronic circuit provided in particular with one or more active components forming filtering and/or amplification means.

The assembly of the chip $30_1$ and the support 70 is carried out for example by bonding or molecular adhesion. To do so, it is possible to carry out a sequence of surface cleanings in order to eliminate potential contaminants and to make the surface of the first chip $30_1$ and the support 70 hydrophilic. A hydrophilic bonding of the first chip $30_1$ on the support 70 makes it possible to obtain good adhesion. This molecular adhesion may be improved by carrying out a thermal annealing, for example at a temperature of the order of 200° C. under nitrogen or argon atmosphere. Good quality bonding is obtained when the support 70 is coated with a layer 71 of silicon oxide.

Such a layer is typically produced by thermal oxidation of a silicon substrate. The thermal oxide layer obtained has for example a thickness comprised between 50 nm and 1 µm.

The support 70 may be provided to receive several elements or chips. In the assembly example illustrated in FIG. 2I, an assembly is also carried out between a second chip $30_2$ and the support 70. This second chip $30_2$ is provided with a nano-object 60, which may be different to that laid out on the first chip $30_1$. The second chip $30_2$ may be derived from the cutting described previously in relation with FIG. 2E or instead have been manufactured totally independently of the first chip $30_1$.

In order to be able to pinpoint the location provided for the chips $30_1$, $30_2$ alignment reference points may be produced on the upper face of the support 70.

The chips $30_1$, $30_2$ may also be provided with specific alignment marks on the upper face in order to make it possible to arrange them precisely on the support 70.

The reference points and alignment marks may be for example in the form of trenches. The alignment marks provided on a chip $30_1$ may have been produced at the same time as the locating marks 5, the production of which has been described previously in relation with FIG. 2B.

An alignment or a superposition of the reference points and alignment marks of the chips $30_1$, $30_2$ and of the support 70 may thus be carried out in order to be able to check the correct positioning of these two parts of the device with respect to each other.

One or more additional elements may also be assembled on the upper face of the support 70. In the example of embodiment illustrated in FIG. 2I, an additional element in the form of a dummy block 80 is further assembled, which has neither component nor connection element but may be provided to make it possible to even out stresses on the support 70 and/or to limit the relief. Such a dummy block 80 participates in maintaining integral the elements of the assembly and avoiding disbondment of the chips $30_1$, $30_2$ of the support 70. In this case, the block 80 may have a height substantially equal to that of the chips $30_1$, $30_2$ assembled on the support 70. In an advantageous embodiment this dummy block may have substantially the same dimensions as the chip with which it is juxtaposed.

Figure 2J:
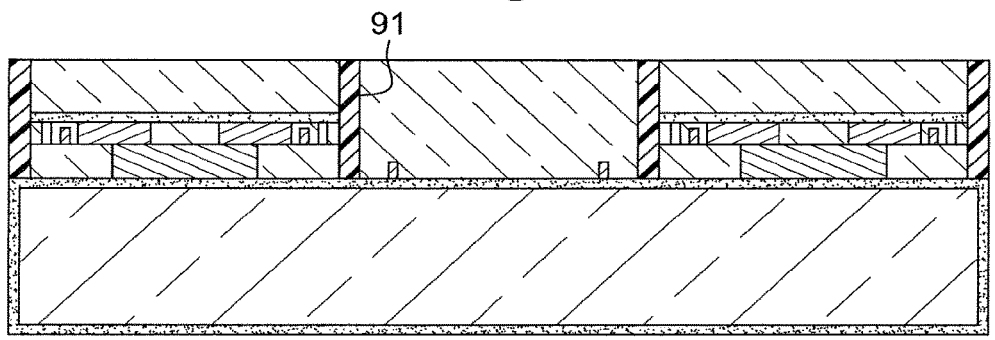

Then, once this assembly has been carried out, it is possible to form an insulating layer 91 around the chips $30_1$, $30_2$ and the block 80 (FIG. 2J). This insulating layer 91 may be laid out so as to fill interstices or spaces between the chips $30_1$, $30_2$ and the block 80 and to form a lateral wall or an enclosure making it possible to favour the integral holding of the assembly formed between the chips $30_1$, $30_2$, and the support 70. Such an insulating layer 91 may thus be provided to make it possible to prevent disbondment of the chips $30_1$, $30_2$. The insulating layer 91 may be for example based on silicon oxide or polymer. The insulating layer 91 may also make it possible to produce chip to chip electrical insulation, to form a protective barrier of the lateral sides of the chips $30_1$, $30_2$.

Such a step is particularly adapted when an assembly of chips of very small size is carried out, in particular of surface area less than 1 $mm^2$, because the smaller the surface in contact with the substrate 2, the greater generally the risk of uncoupling between the chip and the support.

In the case where it proves necessary to eliminate part of the insulating layer 91 covering the chips $30_1$, $30_2$, a planarization by CMP (Chemical Mechanical Polishing) may then be carried out.

Then, a thinning of the assembly is carried out, in particular from the side where the chips $30_1$, $30_2$ are laid out.

Figure 2K:
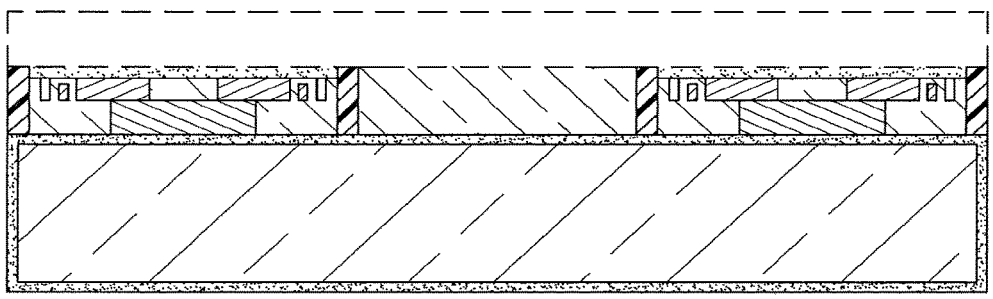

Thus, a portion of the second face is removed from the first chip $30_1$, the second chip $30_2$ and the block 80 (FIG. 2K).

This step may be carried out until reaching the insulating layer 3 of the starting substrate 1 from which the first chip $30_1$ has been produced. When the starting substrate 1 is for example a wafer of diameter 200 mm, it is possible to remove a thickness for example of the order of 725 µm of silicon to carry out such a thinning and to reach the insulating layer 3 of BOX. This removal may be carried out by etching. The support 70 makes it possible to assure a rigid maintaining of the chips $30_1$, $30_2$ during thinning.

The removal of the support layer 2 may be carried out in two phases.

According to a first phase, firstly for example of the order of 70% to 95% of the thickness of the support layer 2 of the substrate 1 is removed by a method of removing material according to a grinding technique.

Then, according to a second phase, 20% to 5% are removed by etching with stoppage on the insulating layer 3 of the substrate. This etching may be carried out by dry process using a technique of RIE (Reactive Ion Etching) type or an etching by wet process in a chemical solution based for example on TMAH. With a solution of TMAH of 20 to 50% concentration by weight with a temperature of 50 to 90° C., it is possible to obtain an etching rate of the order of 0.2 to 1 µm×min$^{-1}$. Such a solution makes it possible to carry out a selective etching with respect to an insulating layer 2 of the oxide based support.

This insulating layer 2 is then conserved.

Figure 2L:
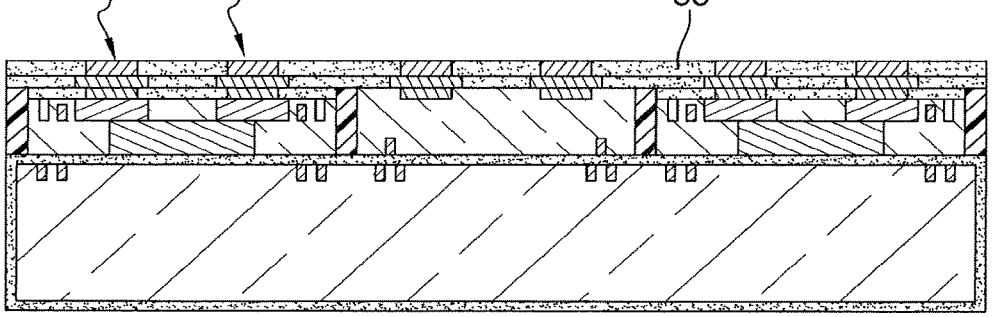

It is then possible to produce connection elements 80a, 80b respectively on the doped areas 8a, 8b (FIG. 2L). These connection elements 80a, 80b are advantageously short and have in particular a length less than 1 µm. In the case where the insulating layer 3 has been preserved these connection elements 80a, 80b are produced through the insulating layer 3 and potentially through one or more additional insulating layers 85 formed on the second face of the first chip $30_1$. The connection elements 80a, 80b are in contact with the doped areas 8a, 8b.

The formation of connection elements 80a, 80b may include for example deposition by electrolysis or by a technique of PVD (Physical Vapour Deposition) of conducting material such as for example AlSi, W, Pt, Au, Al, NiSi.

The connection elements 80a, 80b may have a diameter or a width typically comprised for example between 100 nm and several tens of microns typically of the order of 3 µm.

The connection elements 80a, 80b may also have a height comprised for example between 10 nm and several µm, for example of the order of 400 nm.

The connection elements 80a, 80b may each be formed of a conducting via 82 and/or a conducting line 83 ending for example in a conducting pad 81 at the surface of the assembly.

Figure 8:
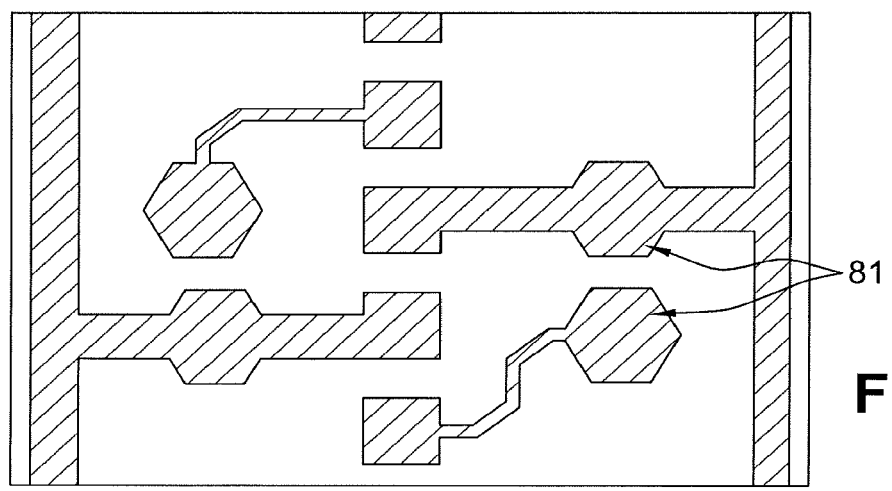
FIG. 8 illustrates an example of layout of connection pads connected to a nano-object arranged on a chip itself assembled on a substrate.

A conducting pad 81 for example of width greater than 70 µm and of length greater than 70 µm is for example produced in order to make it possible to receive micro-points of an external electrical system adapted to carry out electrical measurements of the nano-object 50. An example of layout of conductive pads 81 on the surface of the support-chip assembly is given in FIG. 8.

A possibility of implementation of the device provides for the formation of connection elements making it possible to interconnect different chips $30_1$, $30_2$, together and/or different nano-objects together.

It is possible to assure a collective contact pick-up between all the bonded chips to carry out an electrical measurement, either collective or on certain chips. Such a collective contact pick-up makes it possible to measure in series several nano-objects and thus to increase the electrical signal injected into a nano-object.

A variant of embodiment of the example of method described previously includes, after the step of formation of the nano-object 50 described in relation with FIG. 2G, again transferring a temporary protective cover on the first face of the substrate 1, so as to protect the nano-object 50. A bonding of the same temporary cover 20, or a new temporary cover, makes it possible to assure hermetic protection of the nano-object 50 as long as the assembly with the support 70 has not been carried out.

Another variant provides for using a temporary encapsulation layer of the nano-object, which is removed before carrying out the assembly between the chip 301 and the support 70.

Figure 3:
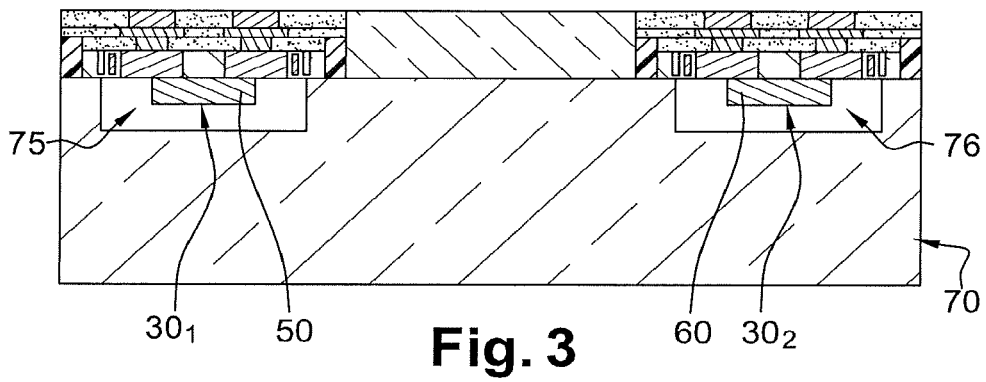
FIG. 3 illustrates a variant of embodiment in which the substrate is provided with at least one cavity for receiving the nano-object.

According to another variant illustrated in FIG. 3 of one or the other of the examples described previously, the support 70 on which the chips $30_1$, $30_2$ are assembled is provided on its upper face with cavities 75, 76 in which the nano-objects 50, 60 of the chips $30_1$, $30_2$ are housed.

Such cavities 75, 76 make it possible to produce an assembly of chips $30_1$, $30_2$ on the support 70 without the nano-objects 50, 60 on which these chips $30_1$, $30_2$ are arranged being crushed.

In addition to making it possible to assure protection of the nano-objects 50, 60, such cavities 75, 76 also make it possible to make the device more compact. The cavities 75, 76 have dimensions provided greater than those of the nano-objects 50. As an example of cavities 75, 76 having a surface area comprised between 300 nm$^2$ and several hundreds of µm$^2$ and a depth between 500 nm$^2$ to several hundreds of µm$^2$ may be provided. The cavities 75, 76 are produced for example by steps of photolithography and etching.

Figure 4:
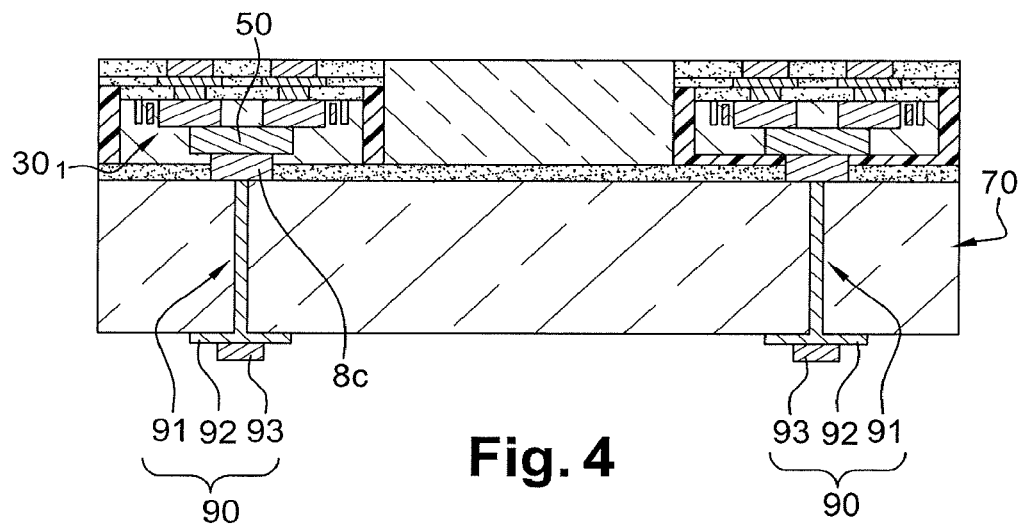
FIG. 4 illustrates a particular example of embodiment in which at least one additional connection element traverses the thickness of the substrate to enable a contact pick-up on its lower face.

In FIG. 4, a variant of embodiment of the device provides for an additional connection element 90 traversing the thickness of the support 70 and emerging on the lower face $F_2$ of the support 70 in order to make it possible to establish an electrical connection between a nano-object 50 arranged on the side of the upper face $F_1$ of the support and an external electrical system (not represented). This additional connection element 90 may be formed for example of a via 91 extending between the lower face $F_2$ and the upper face $F_1$ of the support 70, and at least one conducting line 92 and/or a conducting pad 93 laid out against the lower face $F_2$ of the support 70. The additional connection element 91 may be connected to an additional conducting area 8c produced on the first face of the chip $30_1$ and in contact with the nano-object 50.

Figure 5:
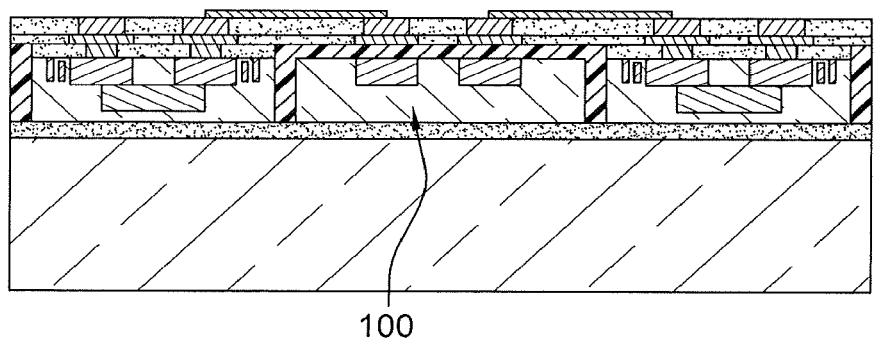
FIG. 5 illustrates an example of embodiment in which an electronic circuit provided with a filtering and/or amplification block is arranged on the same substrate as that on which the chip provided with the nano-object is transferred.

In another example of embodiment illustrated in FIG. 5, it is provided to integrate an electronic circuit 100 arranged on the upper face F1 of the support 70. This electronic circuit 100, for example produced using CMOS technology, is provided with one or more active components. The electronic circuit 100 may be equipped with one or more stages of amplification and/or filtering of a signal from one or the other of the chips $30_1$, $30_2$.

The electronic circuit 100 may also include a device for addressing the chips $30_1$, $30_2$.

Figure 6:
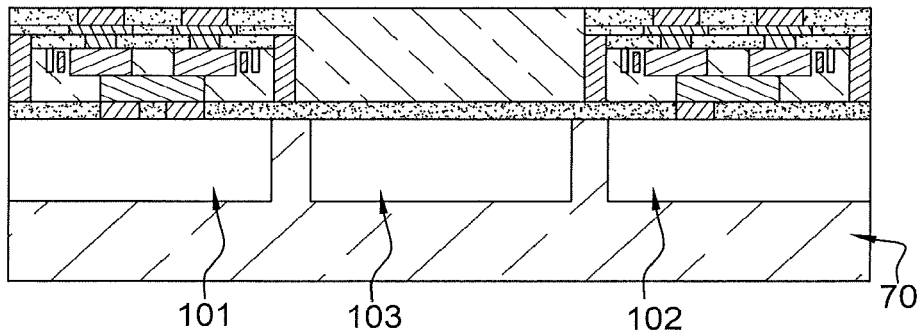
FIG. 6 illustrates an example of embodiment in which the substrate on which the chip is transferred is provided with at least one integrated circuit with one or several active components.

In the example of embodiment illustrated in FIG. 6, it is the support 70 itself which comprises at least one active electronic circuit, and in particular a first active circuit 101 on which the first chip $30_1$ is situated and connected, as well as a second active circuit 102 on which the second chip $30_2$ is laid out and connected. The support 70 may also include a block 103 provided with passive components between the first active circuit 101 and the second active circuit 102.

Figure 7:
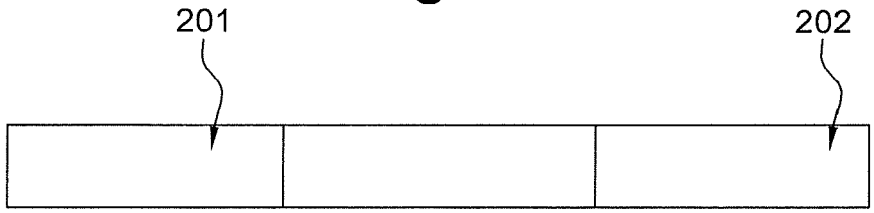
FIG. 7 illustrates an example of embodiment in which an integrated circuit is transferred onto the chip which is assembled to the substrate and is provided with a nano-object.
Figure 7:
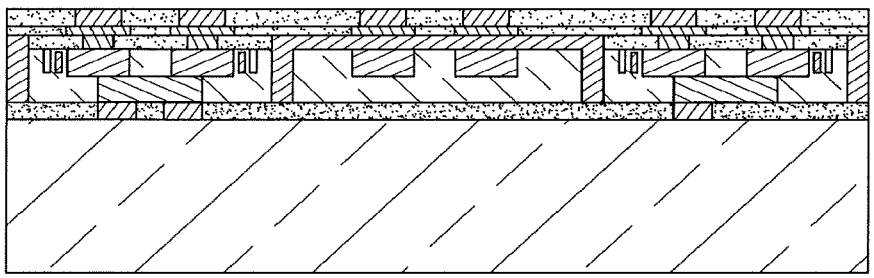

In the example of embodiment illustrated in FIG. 7, after having carried out the assembly of the support 70 and the chips $30_1$, $30_2$, circuits are transferred onto these chips $30_1$, $30_2$, and in particular a first active circuit 201 that is laid out on the first chip $30_1$ and a second active circuit 202 that is arranged on the second chip $30_2$. As in the examples given previously, the active circuits 201, 202 formed on the first chip $30_1$ and on the second chip $30_2$ may be provided with amplification and/or filtering means.

A device as described previously formed of an assembly between at least one chip and a support may itself be transferred onto another support, potentially of greater size, or instead be transferred to an assembly of the same type in order to produce a device with several stages of chips and nano-objects.

A device as described previously finds applications notably in electronics, optics, chemistry and biology.

In particular, it makes it possible to produce, on the one hand, a molecular characterization device and, on the other hand, hybrid chips, for example hybrid MOS/molecule circuits.

The invention makes it possible, among other things, to integrate molecular electronics with microelectronics, in particular CMOS technology.

The invention proposes, among other things, a device making it possible to characterize and exploit the electrical, optical, chemical or biological properties of molecules that have been purposely synthesized. This device is obtained using tools, methods and infrastructures that have been developed in microelectronics for the manufacture of advanced MOS transistors (small gate width transistors).

The invention also proposes a novel architecture making it possible to integrate both molecular components and microelectronic components on the same substrate.

The invention claimed is:

1. A device for connecting at least one nano-object to an external electrical system, the device comprising:
   a front face of the device;
   a rear face of the device opposite said front face of the device;
   a substrate including an upper face and a lower face opposite said upper face of the substrate, said upper face of the substrate including at least one circuit including at least one active or passive component, and said lower face of the substrate being said rear face of the device; and
   at least one first chip including a plurality of conducting areas, a plurality of connection elements, and at least one first nano-object, the at least one first chip being positioned on the upper face of the substrate, wherein
   the at least one first nano-object is connected to a first conducting area of the at least one first chip and a second conducting area of the at least one first chip, and faces said upper face of the substrate, said upper face of the substrate being situated between said front face of the device and said rear face of the device,
   the plurality of connection elements are provided on the front face of the device connecting the external electrical system and arranged respectively on and in contact respectively with said first conducting area and said second conducting area of the at least one first chip, the plurality of connection elements being accessible from a side of the front face of the device, and
   each of the plurality of conducting areas and the at least one first nano-object of the at least one first chip are positioned between the upper face of the substrate and the front face of the device.

2. The device according to claim 1, wherein the at least one circuit includes a second chip arranged on the substrate, the second chip including at least one conducting area of the second chip and at least one second nano-object connected to said conducting area of the second chip.

3. The device according to claim 1, wherein the substrate includes at least one cavity at the level of the upper face of the substrate, the at least one first nano-object being housed in the cavity.

4. The device according to claim 1, further comprising:
   at least one other electrical connection element connected to the at least one first nano-object, said other electrical connection element traversing the substrate and emerging on the upper face of the substrate.

5. The device according to claim 1, wherein the circuit includes an amplification circuit or a filtering circuit.

6. The device according to claim 5, wherein the plurality of conducting areas of the at least one first chip are distinct doped areas formed in a semiconductor layer.

7. A device for connecting at least one nano-object to an external electrical system, the device comprising:
   a front face of the device;
   a rear face of the device opposite said front face of the device;
   a substrate including an upper face and a lower face opposite said upper face of the substrate, said lower face of the substrate being said rear face of the device; and
   at least one first chip including a plurality of conducting areas, a plurality of connection elements, at least one electrical element, at least one first nano-object, and at least one second nano-object, the at least one first chip being positioned on said upper face of the substrate, wherein
   said at least one first nano-object includes an upper surface and a lower surface, the upper surface of said at least one first nano-object being connected to a first conducting area of the at least one first chip and a second conducting area of the at least one first chip, the lower surface of said at least one first nano-object being connected to said at least one second nano-object,
   said at least one second nano-object facing said upper face of the substrate, said upper face of the substrate being situated between said front face of the device and said rear face of the device,
   the plurality of connection elements are provided on the front face of the device connecting the external electrical system and arranged respectively on and in contact respectively with said first conducting area of the at least one first chip and said second conducting area of the at least one first chip, the plurality of connection elements being accessible from a side of said front face of the device,
   said at least one electrical element connected to said at least one second nano-object and extends from said upper face of the substrate to said lower face of the substrate, said at least one electrical element traversing the substrate, and
   each of the plurality of conducting areas and the at least one first nano-object of the at least one first chip are positioned between the upper face of the substrate and the front face of the device.

8. The device according to claim 7, further comprising:
   at least one circuit including at least one active or passive component, arranged on the upper face of the substrate or integrated in the substrate.

9. The device according to claim 8, wherein the circuit includes an amplification circuit or a filtering circuit.

\* \* \* \* \*